(12) United States Patent
Jaslier et al.

(10) Patent No.: US 6,432,478 B2
(45) Date of Patent: Aug. 13, 2002

(54) CERAMIC HEAT BARRIER COATING HAVING LOW THERMAL CONDUCTIVITY, AND PROCESS FOR THE DEPOSITION OF SAID COATING

(75) Inventors: Yann Philippe Jaslier, Melun; André Hubert Louis Malie, Targe; Jean-Pierre Julien Charles Huchin, Chatellerault; Serge Alexandre Alperine, Paris; Romain Portal, Evry, all of (FR)

(73) Assignee: Societe Nationale d'Etude et de Construction de Moteurs d'Aviation "Snecma" and Snecma Services, Paris (FR)

( * ) Notice: Subject to any disclaimer, the term of this patent is extended or adjusted under 35 U.S.C. 154(b) by 0 days.

(21) Appl. No.: 09/758,195

(22) Filed: Jan. 12, 2001

Related U.S. Application Data

(62) Division of application No. 09/325,042, filed on Jun. 3, 1999, now Pat. No. 6,251,504.

(30) Foreign Application Priority Data

Jun. 4, 1998 (FR) .............................. 98 06986

(51) Int. Cl.⁷ ................................................ C23C 14/54
(52) U.S. Cl. .............................. 427/255.32; 427/255.7; 427/597
(58) Field of Search ......................... 427/255.32, 255.7, 427/597

(56) References Cited

U.S. PATENT DOCUMENTS 5,652,044 A    7/1997  Rickerby
5,792,521 A  * 8/1998  Wortman .................. 427/248.1
5,942,334 A    8/1999  Wortman
5,998,003 A  * 12/1999 Courtright et al. .......... 428/216
6,110,604 A  * 8/2000  Rickerby .................. 204/192.1

FOREIGN PATENT DOCUMENTS

GB        2 252 567           8/1992
GB        2252567      *      8/1992

OTHER PUBLICATIONS

J. T. Prater et al, "Ceramic Thermal Barrier Coatings with Improved Corrosion Resistance", *Surface and Coatings Technology*, vol. 32, 1987, pp. 389–397.

Patent Abstract of Japan, vol. 095, No. 011, Dec. 26, 1995 & JP 207441 A, Aug. 8, 1995.

"Deposit and Etch Technique For Making Smooth, Low Resistivity Tungsten Films", *Research Disclosure*, No. 305, Sep. 1, 1989, p. 633, XP000070496.

* cited by examiner

*Primary Examiner*—Timothy Meeks
(74) *Attorney, Agent, or Firm*—Oblon, Spivak, McClelland, Maier & Neustadt, P.C.

(57) ABSTRACT

A ceramic heat barrier coating is deposited on a substrate so that the coating has a columnar growth pattern which is interrupted and repeated a number of times throughout its thickness by successive regermination of the ceramic deposit. The regermination is obtained by a vapor phase deposition process wherein a polluting gas is introduced intermittently during the deposition of the ceramic. The resulting ceramic coating has a lower thermal conductivity than conventional columnar ceramic coatings.

9 Claims, 5 Drawing Sheets

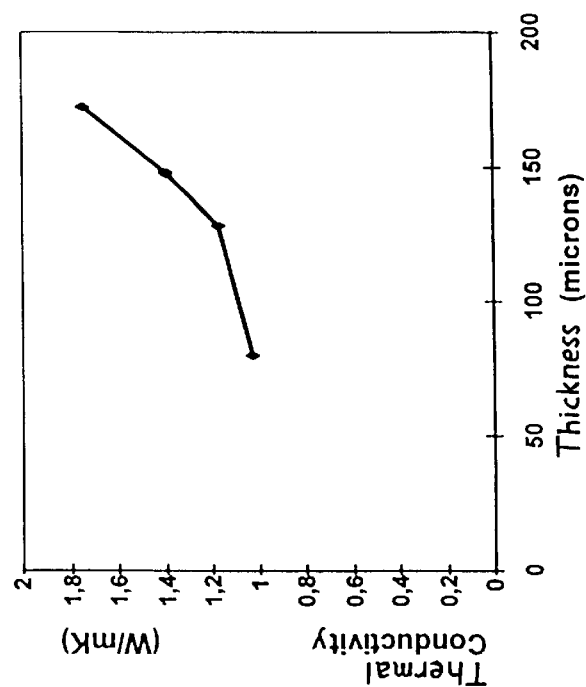
Fig: 2
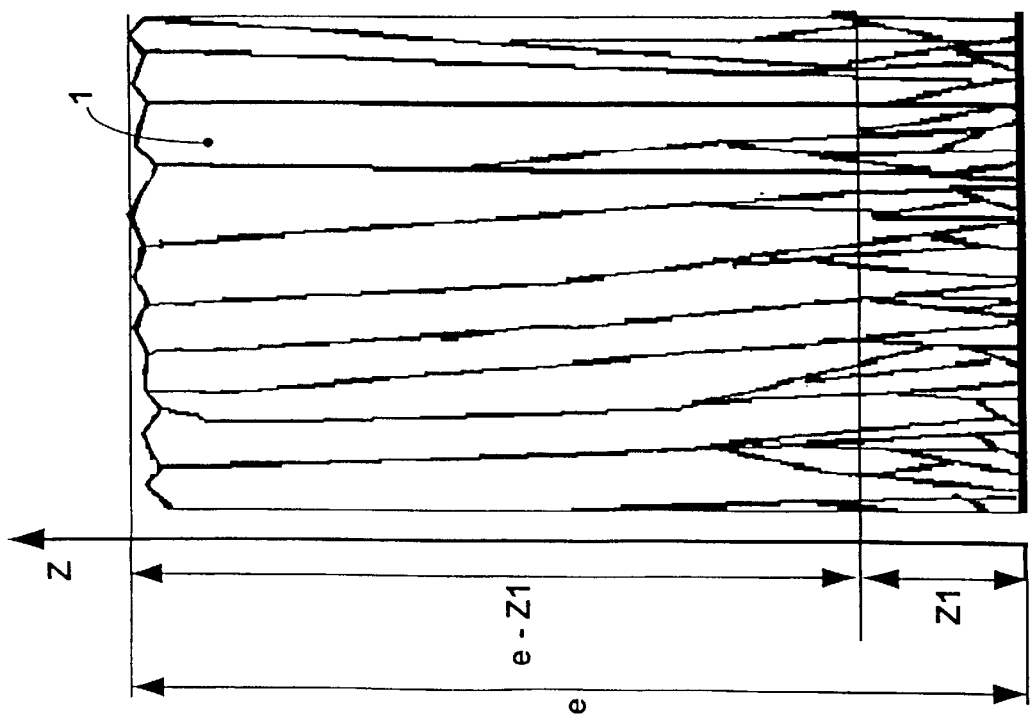
Fig: 1

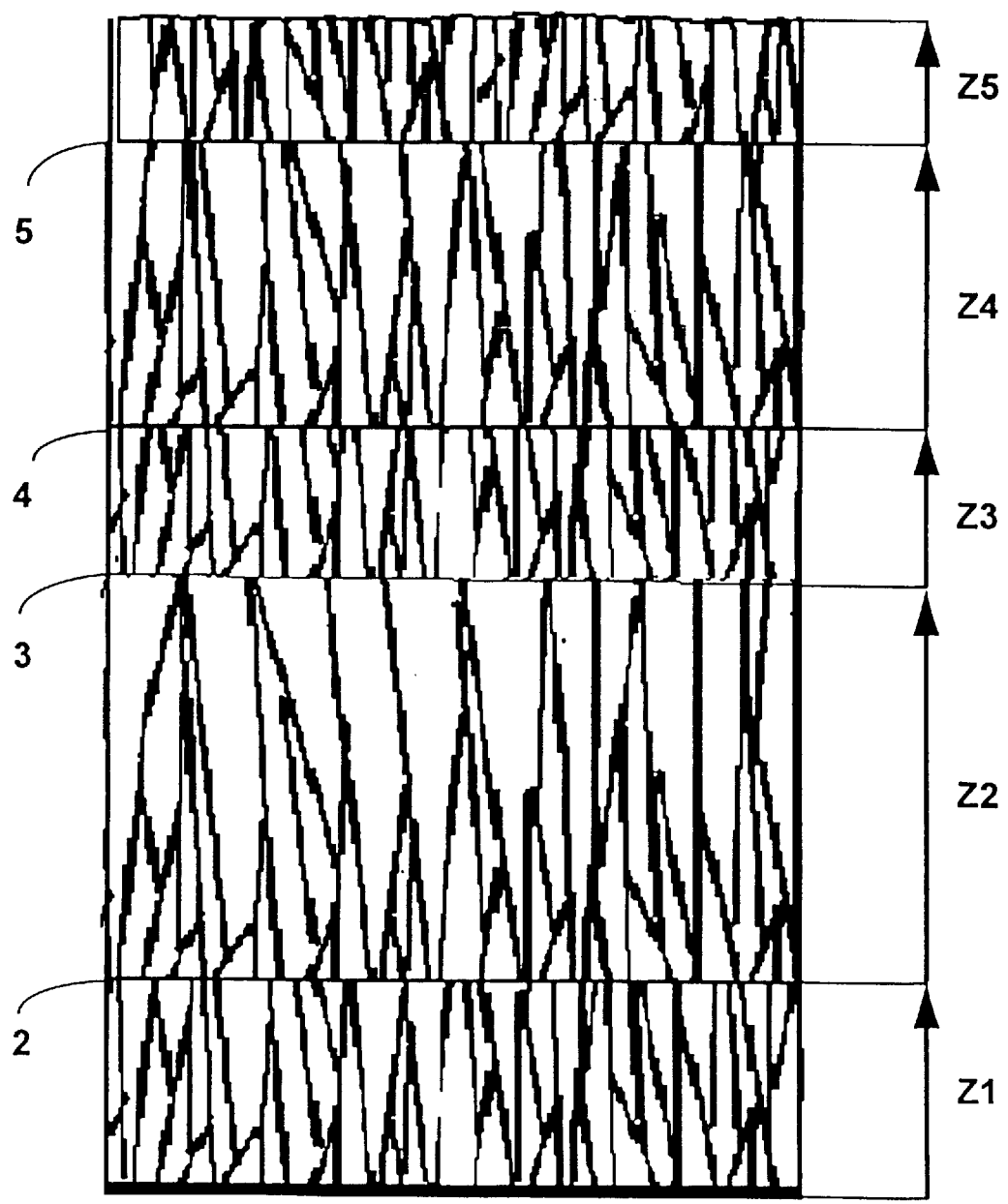
Fig : 3

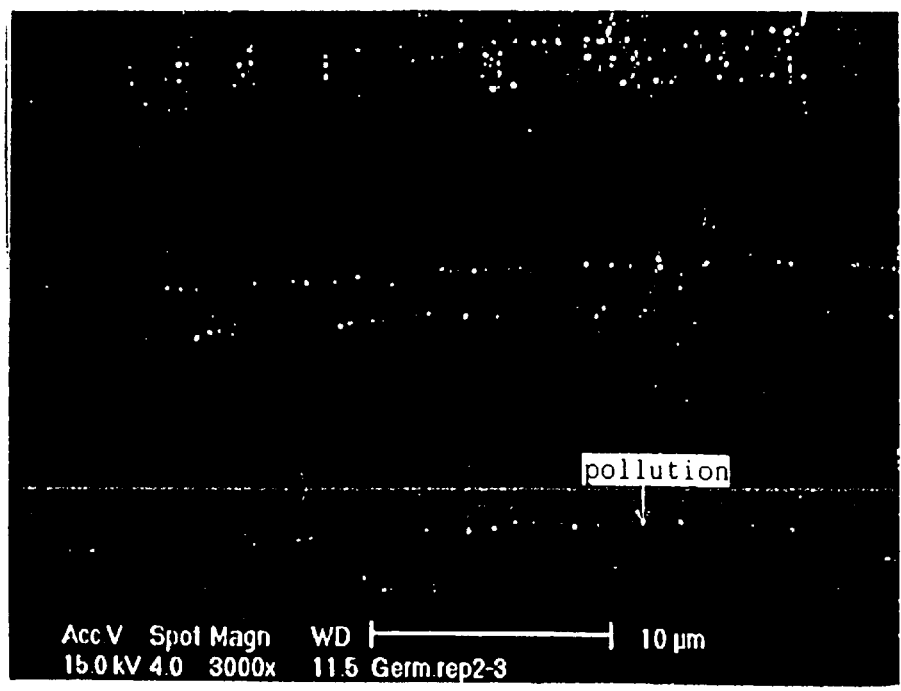
Fig : 4 a
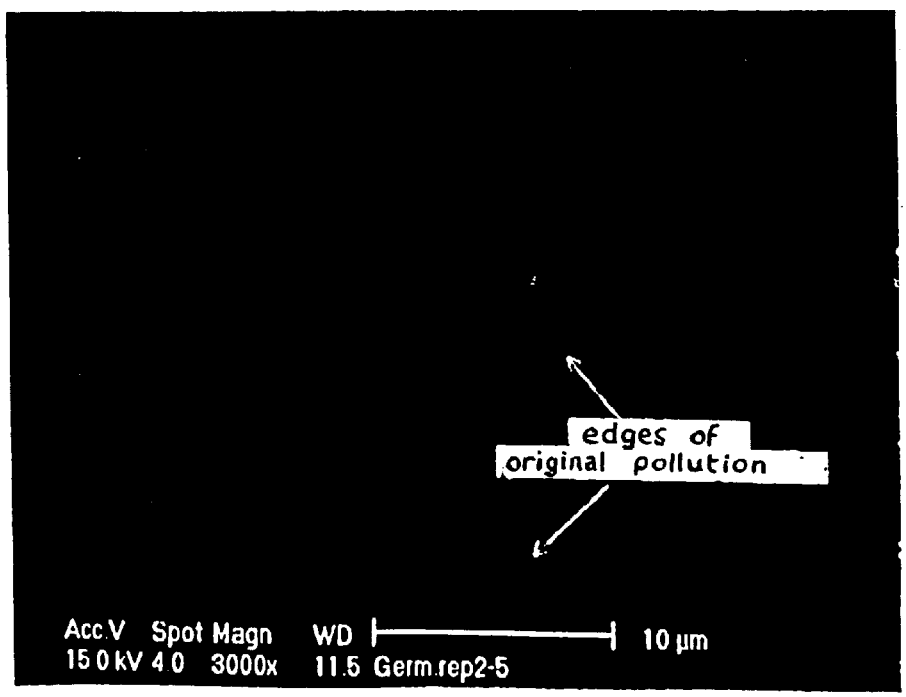
Fig : 4 b

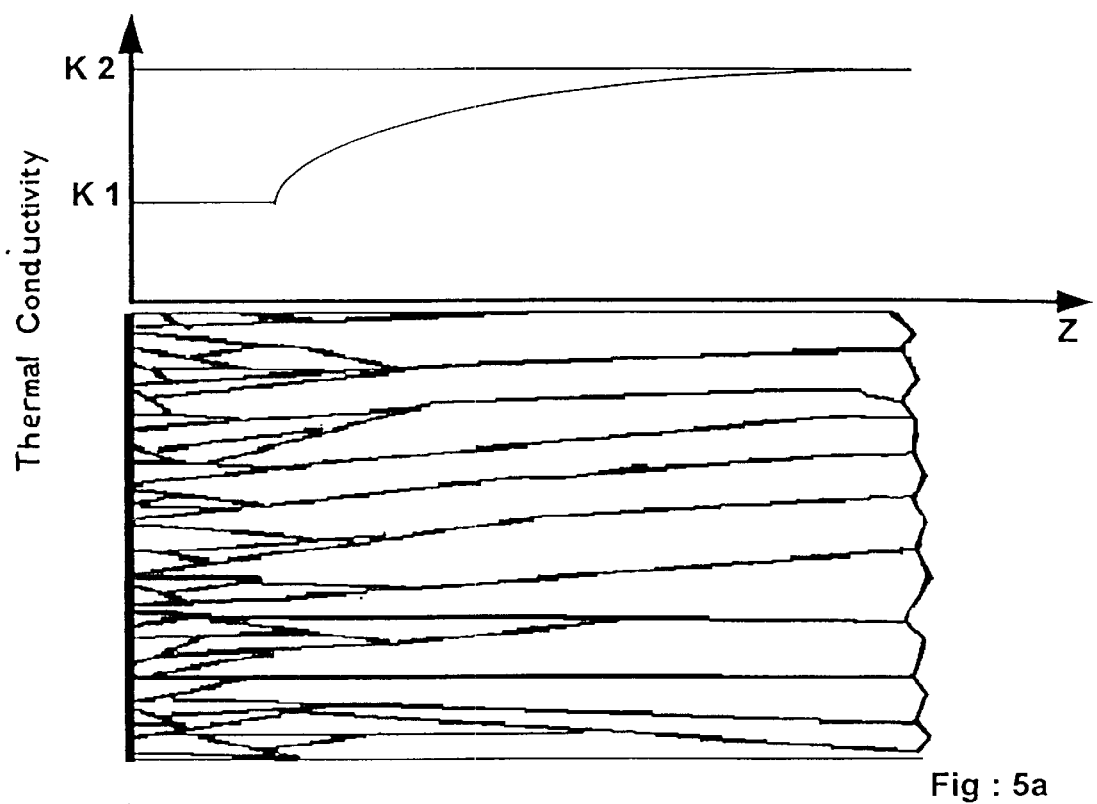
Fig : 5a
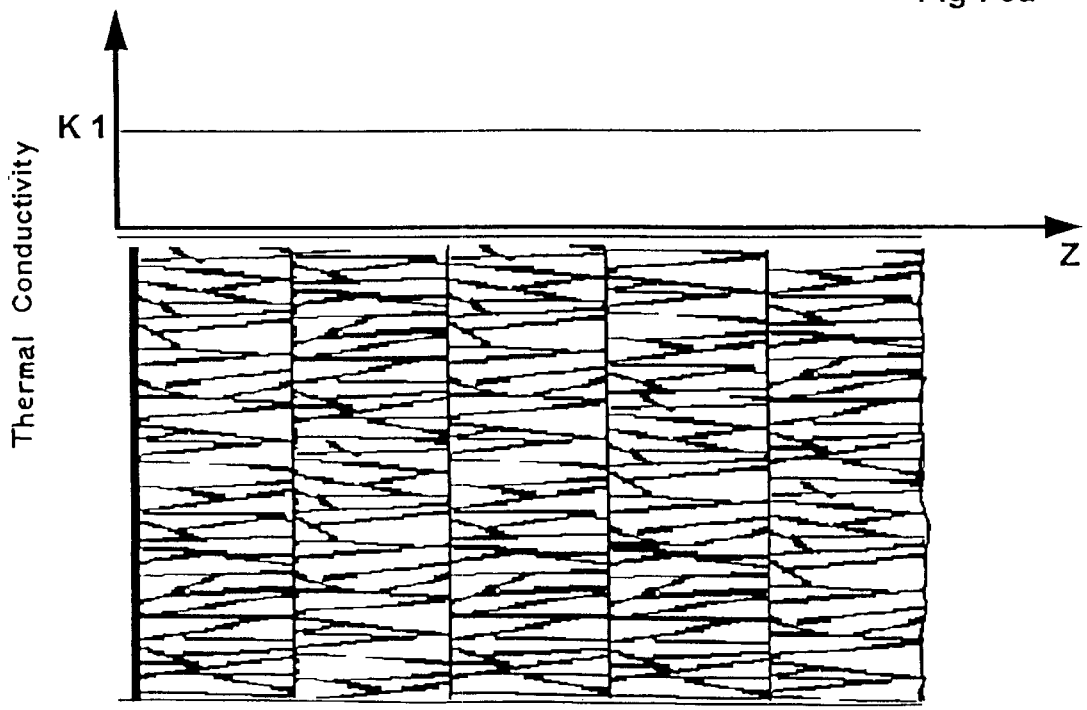
Fig : 5b

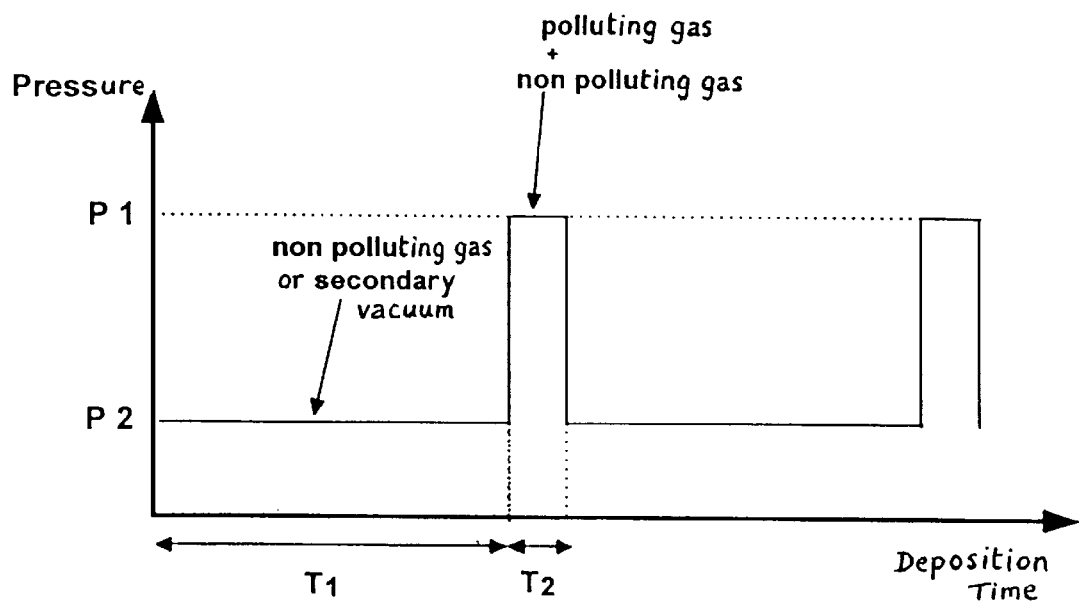
Fig : 6
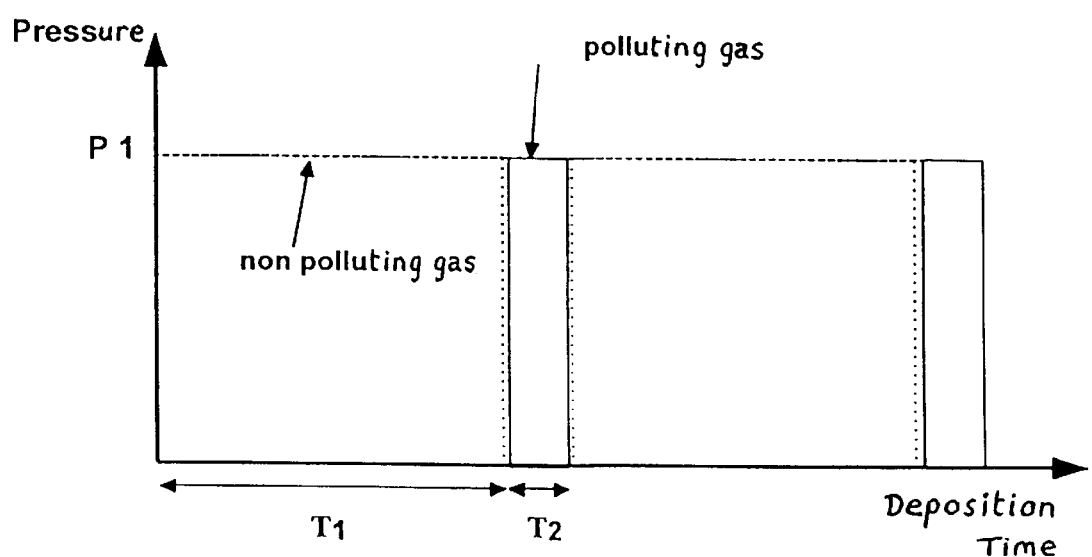
Fig : 7

CERAMIC HEAT BARRIER COATING HAVING LOW THERMAL CONDUCTIVITY, AND PROCESS FOR THE DEPOSITION OF SAID COATING

This application is a divisional of prior application U.S. Ser. No. 09/325,042, filed Jun. 3, 1999, now U.S. Pat. No. 6,251,504.

BACKGROUND OF THE INVENTION

1. Field of the Invention

The invention relates to a ceramic heat barrier coating having low thermal conductivity, a process for depositing such a ceramic coating, and to metal articles protected by the coating. The invention is particularly applicable to the protection of hot superalloy components of turbomachines, such as the turbine blades or diffusers.

2. Summary of the Prior Art

The manufacturers of turboengines, whether for use on land or in aeronautics, face constant demands to increase engine efficiency and reduce fuel consumption. One way of addressing these demands is to increase the burnt gas temperature at the turbine inlet. However, this approach is limited by the ability of the turbine components, such as the diffusers and moving blades of the high pressures stages, to withstand high temperatures. Refractory metallic materials known as superalloys have been developed to make such components. These superalloys, which are nickel or cobalt or iron based, give the component mechanical strength at high temperature (creep resistance). The maximum temperature at which these superalloys can be used is 1100° C., which is well below the temperature, typically 1600° C., of the burnt gases at the turbine inlet. The blades and diffusers are therefore provided with internal cavities and are cooled by convection by the introduction of air into these internal cavities taken at a temperature of 600° C. from the compressor stages. Some of this cooling air flowing in the internal channels of the components discharges through ventilation apertures in the wall to form a film of cool air between the surface of the component and the hot turbine gases. To obtain significant temperature gains at the turbine inlet it is known to deposit a heat barrier coating on the components.

Heat barrier technology consists of coating the components with a thin insulating ceramic layer varying in thickness from a few tens of micrometers to a few millimeters. The ceramic layer typically consists of zirconia stabilised with yttrium and has the advantages of low thermal conductivity and the good chemical stability necessary in the severe conditions experienced during turbine operation. A bonding sublayer of an aluminoforming metal alloy can be interposed between the superalloy and the ceramic layer and serves to boost the adhesion of the ceramic layer while protecting the substrate from oxidation.

However, the application of a ceramic coating to a metal article poses the problem of differential expansion of the metal and the ceramic during thermal cycling. The thermal expansion coefficient of zirconia-based ceramics, although relatively high, is still appreciably below that of metals. The microstructure of the coating must therefore be controlled so as to be able to withstand, without flaking, the heat deformations caused by the metal substrate.

Heat spraying and physical deposition in the vapour phase of an electron beam, called EB-PVD (electron beam physical vapour deposition) for short, are the two industrial processes used to deposit the heat barriers. For application to the aerodynamic part of the blades and diffusers the EB-PVD method is preferred to heat spraying, mainly because it gives a coating with a better surface texture and reduces obstruction of the ventilation apertures. Also, the EB-PVD process helps to provide the layer with a microstructure in the form of microcolumns perpendicular to the article surface. The microstructure enables the coating to deal with thermal and mechanical deformations in the plane of the substrate. For this reason EB-PVD heat barriers have a thermomechanical fatigue life which is considered to be better than that of plasma-sprayed ceramic layers.

In vapour deposition processes the coating is the result of vapour condensing on the article to be covered. There are two categories of vapour phase processes—physical processes (PVD) and chemical processes (CVD). In physical vapour phase processes the coating vapour is produced by vaporization of a solid material, also called the target. Vaporization can be produced by evaporation caused by a heat source or by cathodic atomization, a process in which the material is atomized by ionic bombardment of the target. In chemical vapour phase processes the coating vapour is the result of a chemical reaction between the gaseous components, which occurs either in the vapour phase or at the coating/gas interface. The vapour phase deposition processes are carried out in a controlled atmosphere to prevent contamination or pollution of the deposits by reaction with unwanted gas components. To this end, the deposition chamber is preliminarily exhausted to a secondary vacuum (between $10^{-6}$ Torr and $10^{-4}$ Torr) and baked. An inert or reactive working gas can be introduced in a controlled manner during deposition.

The evaporation of refractory and ceramic materials requires intense heating means. Accordingly, electron beam heating is used. The ceramic material to be evaporated is in the form of sintered bars whose surface is swept by a focused electron beam. Some of the kinetic energy of the beam is converted into heat on the bar surface. A particular feature of the EB-PVD process is that the working pressure is reduced so as to facilitate evaporation of the bars and the transfer of coating vapour from the target to the substrate. Also, electron guns require pressures of less than $10^{-4}$ Torr if they are to operate (arcing problems) which means that the electron gun must be pumped separately from the pumping of the chamber.

During the EB-PVD deposition of heat barriers the articles are heated to a high temperature of around 1000° C. by radiant heating of the bars. The surface temperature thereof is estimated by be 3500° C. At this temperature some of the zirconia molecules from the bar surface are dissociated in the reaction:

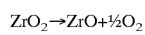

$$ZrO_2 \rightarrow ZrO + \tfrac{1}{2}O_2$$

Some of the oxygen thus dissociated from the zirconium oxide molecules is lost as a result of the pumping of the chamber, with the consequence that the zirconia deposits are rendered substoichiometric (oxygen depleted). This effect can be countered by the introduction of an oxygen-rich gas (typically a mixture of argon and oxygen) at a pressure of a few milli-Torr into the chamber during the deposition. The effect can also be corrected ex-situ when no reactive gas is introduced into the chamber during deposition. The stoichiometry of the coating is then restored by subjecting the coated articles to a simple annealing in air at a temperature of 700° C. for 1 hour. The introduction of oxygen into the EB-PVD chamber also helps to preoxidise the articles in situ before the ceramic deposition. The alumina film thus formed on the surface of the bonding sublayer provides satisfactory adhesion of the ceramic layer. In the industrial EB-PVD process only those article surfaces facing the vaporization source are coated. To cover an article of a complex geometrical shape, such as a rotor blade or a diffuser, the article must be rotated in the flow of coating vapour.

EB-PVD ceramic layers may have undeniable advantages for use on turbine blades, but they suffer from the major disadvantage of a thermal conductivity (typically from 1.4 to 1.9 W/mK) which is twice that of plasma sprayed heat barriers (from 0.5 to 0.9 W/mK). This difference in thermal conductivity is associated with the morphology of the deposits. The ceramic microcolumns perpendicular to the article surface which are found in EB-PVD depositions offer little hindrance to heat transfer by conduction and by radiation, whereas plasma sprayed depositions have a network of micro cracks which extend substantially parallel to the plane of the deposit, usually in the form of incomplete joints between the ceramic droplets which are crushed in the spraying. These micro cracks are much more effective in preventing heat conduction through the deposit. The insulation provided by a ceramic layer is proportional to its conductivity and thickness. For a given insulation level, halving the thermal conductivity of the ceramic layer would enable the coating thickness to be approximately halved—a considerable advantage when used on rotor blades subjected to centrifugal force.

WO 96/11288 describes a composite laminated heat barrier coating consisting of a stack of nanometric layers of a thickness between 0.001 and 1 micrometer and of a different nature (typically zirconia/alumina). The reduced thermal conductivity associated with such a structure is attributed to the dispersion of the phonons at the interfaces between the layers, the phonons being largely responsible for conductive transfer in dielectrics. The aforementioned document describes multilayer coatings of small thickness of the order of 4 to 5 micrometers which have a thermal conductivity half the value calculated from a law of the mixture. The reduction in thermal conductivity provided by this coating results from the creation of interfaces between two layers of different kinds. However, a sandwich structure of this kind consisting of nanometric layers suffers from thermal instability. During long spells at the high temperatures (about 1100° C.) characteristic of the operating conditions experienced in turbines the fine layers may interdiffuse and homogenize the material—i.e., the interfaces responsible for reducing the thermal conductivity disappear.

WO 93/18199 and EP 0705912 disclose a heat barrier comprising a ceramic coating which consists of a number of layers of different structure. Adjacent layers have a different structure from one another in order to be able to produce an interface between each layer. The columnar morphology of the coating through its thickness is retained, this being considered to be a basic property for withstanding thermal cycling. In this coating the multilayer structure is obtained by intermittent ionic bombardment of the layer surface in conjunction with vapour condensation. The ionic bombardment is produced by polarising the article at a high negative voltage so that the article becomes the cathode of a gas discharge. The effect of the intermittent bombardment on the morphology of the resulting ceramic layer leads to the creation of relatively dense ceramic layers. However, a layer of this kind is not suitable for retaining a low thermal conductivity since heat ageing leads of course to densification of the columns and reduces the density spread between the various layers. Also, the association of a high voltage with the high temperatures (1000° C.) required for EB-PVD deposition greatly complicates industrial implementation of the method.

As a rule, heat barriers having a laminated microcomposite structure (more commonly called a multilayer structure)—i.e., a microstructure based on the presence of interfaces to increase the resistance to heat flow—are unsuitable for high-temperature use because of the instability of the interfaces in operation. Because of diffusion at high temperatures an interface between two materials having a different composition or structure from one another breaks down in a graduated zone. This implies the disappearance of the interface and its associated heat resistance.

SUMMARY OF THE INVENTION

It is an object of the invention to provide a ceramic heat barrier coating which has a heat resistance equivalent to that of conventional ceramic coatings and a thermal conductivity at least half that of coatings obtained by the conventional EB-PVD processes, the thermal conductivity not degrading with age during operation and even improving.

To this end, the invention provides a ceramic heat barrier coating deposited on a substrate, said coating comprising a columnar growth pattern interrupted and repeated a plurality of times throughout the thickness of said coating as a result of successive regermination of the ceramic deposit.

The morphology of the ceramic coating of the invention is different from the conventional columnar structures in which microcolumns are continuous throughout the thickness of the deposit. In contrast, the morphology of the ceramic coating of the invention comprises a pattern of columnar growth which is interrupted and repeated in controlled fashion throughout its thickness, called repeat germination morphology. The coating comprises a fibrous microstructure which is finer than conventional columnar deposits.

The invention also provides a process for vapour phase deposition of a ceramic heat barrier coating wherein germination and growth of the coating are effected in a deposition chamber by vapour condensation on a substrate to be covered, the process including the step of intermittently introducing a polluting gas into the deposition chamber during deposition so as to interact with the surface of the ceramic being deposited and/or with chemical components present in the vapour phase in the chamber in order to produce successive regermination of the ceramic during condensation. The term "polluting gas" denotes a gas which causes a rupture of the crystallographic growth pattern of the coating during deposition without damaging the mechanical integrity of the article.

The invention also relates to a metal superalloy article whose surface is at least partly coated by a ceramic coating in accordance with the invention.

Other preferred features and advantages of the invention will become apparent from the following detailed, but non-limitative, description of the invention and preferred embodiments with reference to the accompanying drawings.

BRIEF DESCRIPTION OF THE DRAWINGS

FIG. 1 is a diagram showing the morphology throughout the thickness of a conventional columnar ceramic coating deposited by a conventional EB-PVD process;

FIG. 2 shows an example of the localized variation of the thermal conductivity of a conventional columnar ceramic coating plotted against its thickness;

FIG. 3 is a diagram showing the morphology throughout the thickness of an example of a repeat germination ceramic coating in accordance with the invention;

FIG. 4a is a photograph showing the fibrous morphology of a repeated germination ceramic coating in accordance with the invention before thermal ageing;

FIG. 4b is a photograph showing the fibrous morphology of the repeated germination ceramic coating after ageing;

FIG. 5a illustrates the thermal conductivity change of a conventional ceramic coating plotted against coating thickness;

FIG. 5b illustrates the thermal conductivity of a repeated germination ceramic coating plotted against coating thickness;

FIG. 6 is a diagram showing a first example of a polluting gas introduction cycle in a process in accordance with the invention; and FIG. 7 is a diagram showing a second example of a polluting gas introduction cycle in a process in accordance with the invention.

DETAILED DESCRIPTION OF THE INVENTION AND PREFERRED EMBODIMENTS

The invention is based on a finding that a vapour phase deposited ceramic coating has a morphology 1 which changes over its thickness such as shown in FIG. 1. This morphology gradient is marked in particular by a density of mircocolumns 1 which decreases as a function of deposit thickness. The microcolumns are very fine at the interface with the substrate and can be likened to fibres, but tend to flare out in the outer region of the ceramic layer. One of the consequences of the change in the morphology of the ceramic coating with its thickness is that the thermal conductivity of the coating increases with its thickness (see FIG. 2). The outer region of the ceramic coating has a thermal conductivity which is higher than the coating region adjacent the substrate. This effect has been noticed in the case of materials which are very good heat conductors, such as diamond deposited by CVD, and in the case of poorer conductors such as yttriated zirconia. The morphology of a vapour phase deposited layer with a columnar structure and thickness e can be modelled as consisting of a layer of thickness $Z_1$ adjacent the substrate in which the average diameter of the columns is low, and an outer layer of thickness $e-Z_1$ in which the average diameter of the columns is high. The thickness of the layer adjacent the substrate with the thin columns corresponds to the germination and competitive growth steps of the microcolumns of the deposit. The outer zone of the coating corresponds to the microcolumns which have passed through the selective competitive growth step. For given deposition conditions the thickness of the competitive growth zone is fixed and does not usually exceed about ten micrometers, whereas the outer growth zone has no theoretical limit and increases with deposition time.

FIG. 3 illustrates an example of a ceramic coating in accordance with the invention. The thick coating comprises a structure which reproduces the germination and competitive growth zone of vapour phase deposits several times throughout the thickness of the coating. However, the germination of layers deposited by conventional vapour phase processes occurs naturally only once, namely at the interface with the substrate. The present invention resides in producing a repeated germination coating. The morphology of a coating produced in accordance with the invention has a columnar growth pattern which consists of the repetition of the structure of the layer adjacent the substrate throughout the thickness of the deposit. To achieve this the columnar growth pattern is interrupted and repeated several times through the thickness of the deposit by successive regermination of the deposit of the ceramic layer. The ceramic coating comprises interfaces 2,3,4 and 5 which are parallel to the deposit plane, these interfaces separating ceramic layers of thickness $Z_1, Z_2, \ldots Z_5$ having the same structure and same composition as one another, each layer corresponding to the germination zone and competitive growth zone typical of vapour phase deposited columnar structures. The morphology of the coating is fibrous rather than columnar, the fibres being oriented substantially perpendicularly to the coating plane. The diameter of the fibres does not exceed 5 micrometers. The thickness of each layer is less than 150 micrometers and is preferably between 1 and 10 micrometers. The thicknesses of the successive layers can be different from one another.

The repeated germination ceramic layer concept is different from the concept of laminated microcomposites in that the layers adjacent one another are the same as regards composition and microstructure. However, the thickness of the layers may vary.

Also, for the use of the coatings as a heat barrier, the concept of a repeated germination ceramic layer is different from the concept of laminated microcomposites to the extent that the formation of an interface between two adjacent layers is intended not to reduce heat flow but to control the structure of the layer which it is required to repeat. Also, it is the structure of each regerminated layer, and not the interfaces between each layer, which helps to reduce the thermal conductivity of the layer.

The ceramic obtained and shown in FIGS. 4a and 4b has a fine structure of fibrous morphology rather than of columnar morphology, which gives such deposits a high surface density and an associated high surface energy making it particularly sensitive to sintering phenomena at high temperature. In other words, thermal ageing in operation may cause a great change in the morphology of the coating due to the sintering phenomena. The interfaces between each zone of regerminated ceramic are caused to disappear. The fibres weld together to form a fine dispersion of substantially spherical porosities which is very effective in reducing the thermal conductivity of the layer. This change reduces rather than increases the thermal conductivity of the layer.

FIGS. 5a and 5b diagrammatically show the change in thermal conductivity of a conventional ceramic coating (FIG. 5a) and the change in thermal conductivity of a repeated germination ceramic coating (FIG. 5b) plotted against coating thickness.

The thermal conductivity of a repeated germination ceramic coating does not increase with coating thickness and its value is near the value obtained for a thin conventional ceramic coating.

The invention also relates to a metal article whose surface is at least partly coated by such a ceramic coating. The metal article may be made of a superalloy. Before the ceramic layer is applied, the article surface may be coated with an aluminoforming alloy sublayer. This sublayer may belong to the class of MCrAlY deposits or diffused deposits which consist of aluminides consisting partly of nickel and of precious metals such as elements of the platinum group. Preferably, the sulphur content of the base alloy and sublayer is less than 0.8 ppm by weight. The application of the ceramic layer may be preceded by the formation of an alumina film adhering to the surface of the sublayer or to the surface of the superalloy without a sublayer.

Regermination of the ceramic layer is not a direct process. Intermittent deposition tests with the EB-PVD process using a shutter for the vaporization source showed that regermination of the ceramic layer cannot be produced just by interrupting and then resuming deposition. Similarly, intermittent deposition on an article surface by rotation of the article in the ceramic vapour flow, which is typical of the industrial EB-PVD process, does not produce regermination of the ceramic layer. However, we have found that regermination of the ceramic layer can be obtained when ceramic deposition is resumed on the surface of a ceramic layer formed previously in an earlier deposition batch. Our interpretation of this result is that once the vacuum is broken and the coated article has left the EB-PVD chamber the surface of the ceramic deposit becomes polluted. The ceramic molecules condensing on the surface of a previously polluted ceramic layer no longer recognise the crystallographic planes of the ceramic and cannot therefore establish an epitaxial relationship with the surface. Resuming deposition on a polluted surface therefore leads to regermination of the ceramic layer. However, a process for producing a heat barrier in which thin elementary layers are deposited in a number of different charges in order to make them regerminate one on top of the other is industrially impractical.

The invention therefore also relates to an industrially viable vapour phase deposition process for forming repeated germination ceramic layers. The process consists of producing regermination in situ of the EB-PVD ceramic layer without interrupting deposition. To this end, we exploit the fact that the coating surface on which the ceramic molecules condense is particularly reactive during deposition because of the free bonds of the surface atoms and the oxygen depletion, the method involving polluting the coating surface in situ during deposition. The surface may be polluted by a variety of methods.

A first pollution method, which may be called the in situ chemical pollution method, is to introduce a reactive polluting gas intermittently into the deposition chamber, the polluting gas interacting with the ceramic layer surface during deposition and/or with the chemical components present in vapour form in the chamber so as to produce regermination of the ceramic material during condensation. The brief introduction of a reactive gas leads to the partial formation of a compound other than zirconia on the coating surface during deposition. The formation of a surface compound amounts to in situ pollution of the ceramic layer surface during deposition and produces its regermination without interrupting deposition. The surface compound can be discontinuous, its distribution on the surface of the ceramic being sufficient to produce regermination of the ceramic layer. Among the reactive gases envisaged in the case where the ceramic consists of oxides, the gases preferred are those which lead to partial surface nitridation or carburization of the ceramic layer. In the case where the ceramic coating consists of carbides, the preferred reactive gases are those which lead to partial surface nitridation or oxidation of the ceramic layer. In the case where the ceramic coating consists of nitrides the preferred gases are those which lead to partial surface carburization or oxidation of the ceramic layer. Typically, the polluting gas is atomic or molecular and consists partly of atoms of elements selected from C, N, O, H, Si, Cl, Br, F and I. As a rule, reactive gases containing nitrogen or ammonia or hydrocarbons or carbon oxides or hydrogen or even halogenated gases can be used.

A second polluting method, called in situ physical pollution involves producing interaction between the surface of the articles undergoing deposition and a non-reactive gas which can be adsorbed on the surface of the deposition without giving rise to a chemical reaction. The adsorption of gas molecules on the surface of the deposit disturbs the condensation of ceramic molecules on clearly defined crystallographic planes. The brief introduction of a gas which is not reactive but which is adsorbed very readily on the surface of the ceramic layer during deposition may interrupt the epitaxial relationship, leading in fact to regeneration of the ceramic layer. The non-reactive gases which may be used for producing an in situ physical pollution may be selected from the inert gases and any other non-reacting gas very likely to be adsorbed on the surface of the deposited ceramic material, such as, for example, the rare gases Xe, Kr, Ar and He, mixtures of rare gases, and carbon monoxide.

A third method of preparing a repeated regeneration ceramic layer is to intermittently condense a material different from the material used for the ceramic layer in conjunction with continuous condensation of ceramic vapour. The brief condensation of a material other than that of the ceramic layer during deposition constitutes pollution, and can be achieved by a flash of the vapour of the polluting material simultaneously with continuous vaporization of the ceramic material. The polluting material may be a metal or a ceramic material whose composition is other than that of the deposited ceramic layer. This process can be performed industrially by using two vaporizing crucibles, one containing the ceramic material and the other the polluting material, the two materials being vaporized individually by an electron beam. The ceramic material in the first crucible is evaporated continuously, whereas the polluting material in the second crucible is evaporated intermittently by a separate electron beam.

A fourth method of preparing a repeated germination ceramic layer is to exploit the reactivity of the ceramic vapour in the vaporization zone. Because of the thermal excitation and the interaction with the primary and secondary electrons originating from the electron bombardment, the ceramic molecules may be in a dissociated, excited and/or ionized state. These various states of excitation of the vapour phase components boosts their chemical interaction with a reactive gas. The condensation of the product of the chemical reaction between a polluting gas and the ceramic vapour on the surface of the coating during deposition provides the pollution. To increase the efficiency of this method the polluting gas may be introduced locally near the vaporization zone.

FIG. 6 shows a first example of a polluting gas introduction cycle. The article is placed in the deposition chamber at a high temperature in the presence of a partial oxygen pressure. The oxygen present in the initial phases of the deposition serves to promote the formation of an alumina film on which the ceramic vapour will condense. Some of the partial oxygen pressure is produced in the EB-PVD chamber by the dissociation of the refractory oxide during vaporization. In addition, the deposition chamber can be supplied with an oxygen-rich gas during the introduction of the articles into the preheating chamber and during the initial deposition phase. This gas is non-polluting. After a deposition time $T_1$, during which the pressure and rate of flow of the non-polluting gas remain constant, a polluting gas is introduced into the chamber for a period $T_2$ which is shorter than the time $T_1$. The polluting gas can be introduced in association with a constant rate of flow of non-polluting gas. Preferably, the introduction of the polluting gas is abrupt (square signal). The rate of flow of the polluting gas is therefore subjected to a pressure control in which the reference value is a high-pressure value $P_1$ (see FIG. 5). After a time $T_2$ the rate of polluting gas flow is interrupted and the pumping speed of the chamber is controlled on the basis of a low-pressure reference value $P_2$. The pumping speed is controlled, for example, by the opening of a diaphragm disposed at the inlet of the pumps. Alternatively, and as shown in FIG. 7, the polluting gas can be introduced into the chamber at a constant total pressure therein by reducing the delivery of non-polluting gas. Whichever configuration is chosen, the partial pressure of the polluting gas must be sufficient to react with the surface of the ceramic layer during deposition in order to produce the regermination. This partial threshold pressure of the polluting gas used depends upon the nature of the gas. Selection of the polluting gas depends upon its chemical or physical reactivity with the ceramic material used for the heat barrier which it is required to deposit. The times $T_1$ and $T_2$ are chosen in dependence upon the ceramic deposition rate. Typically, the thickness of ceramic deposited during the period $T=T_1+T_2$ does not exceed 50 micrometers. Preferably, the thickness of ceramic deposited during this period $T=T_1+T_2$ does not exceed 20 micrometers.

The vapour phase deposition process can be a chemical (CVD) process or a physical (PVD) process. Preferably, the vaporization is effected by electron beam heating.

If the ceramic layer consists of an oxide or a mixture of oxides, the compounds which are the product of the reaction between the ceramic and the polluting gas (oxynitrides, carbides, carbonitrides and so on) tend to disappear during operation due to high-temperature oxidation. This is not a disadvantage to the extent that the sole reason for their presence is to produce regermination of the ceramic layer. They do not need to have post-deposition thermal stability. If the regermination of the ceramic layer is the result of intermittently introducing a non-reactive highly adsorbent gas on the surface of the ceramic layer during deposition, the gases thus trapped tend to be resorbed after annealing at temperatures above the deposition temperature. This is not a disadvantage because the sole reason for their presence is to produce regermination of the ceramic layer. A final advantage of the invention that it can readily be carried out with existing industrial vapour phase deposition installations.

What is claimed is:

1. A process for vapour phase deposition of a ceramic heat barrier coating, comprising:

germinating and growing a ceramic heat barrier coating in a deposition chamber by vapour condensation of ceramic material on a substrate to be covered, said process comprising a step of intermittently introducing a polluting gas into the vapor deposition chamber during deposition of the ceramic material in order to produce successive regerminations of the ceramic during said deposition without interrupting the deposition of ceramic material.

2. A process according to claim 1, wherein said polluting gas interacts with chemical components present in the vapour phase in said deposition chamber to cause regermination of the ceramic during deposition.

3. A process according to claim 1, wherein said polluting gas interacts with the surface of the deposited ceramic to cause regermination of the ceramic during deposition.

4. A process according to claim 3, wherein said polluting gas interacts chemically with the surface of the deposited ceramic.

5. A process according to claim 4, wherein said polluting gas comprises at least atoms selected from the elements C, N, O, H, Si, Cl, Br, F and I.

6. A process according to claim 4, wherein said polluting gas is air.

7. A process according to claim 3, wherein said polluting gas interacts physically by a process of adsorption on the surface of the deposited ceramic.

8. A process according to claim 7, wherein said polluting gas is selected from the group consisting of Xe, Kr, Ar and He, mixtures of said rare gases, and carbon monoxide.

9. A process for vapour phase deposition of a ceramic heat barrier coating, comprising:

germination and growing a ceramic heat barrier coating in a deposition chamber by vapour condensation of ceramic material on a substrate to be covered, said process comprising a step of:

placing two vaporization crucibles in said deposition chamber, one of said crucibles containing a ceramic material and the other of said crucibles containing a pollutant;

continuously vaporizing said ceramic material; and, intermittently vaporizing said pollutant so as to produce successive regerminations of the ceramic during its deposition.

* * * * *

UNITED STATES PATENT AND TRADEMARK OFFICE
CERTIFICATE OF CORRECTION

PATENT NO.   : 6,432,478 B2
DATED        : August 13, 2002
INVENTOR(S)  : Yann P. Jaslier et al.

It is certified that error appears in the above-identified patent and that said Letters Patent is hereby corrected as shown below:

Column 2,
Line 48, "estimated by be" should read -- estimated to be --.

Column 9,
Line 38, "invention that" should read -- invention is that --.

Column 10,
Line 34, "comprising a step of" should read -- comprising steps of --.

Signed and Sealed this

Eighth Day of April, 2003

JAMES E. ROGAN
*Director of the United States Patent and Trademark Office*